United States Patent
Gu et al.

(10) Patent No.: US 11,587,770 B2
(45) Date of Patent: Feb. 21, 2023

(54) APPARATUS AND METHOD FOR TREATING SUBSTRATE

(71) Applicant: SEMES CO., LTD., Cheonan-si (KR)

(72) Inventors: Jamyung Gu, Cheonan-si (KR); Jong-Hwan An, Yongin-si (KR); Goon Ho Park, Seoul (KR); Taehoon Jo, Seoul (KR); Shant Arakelyan, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 193 days.

(21) Appl. No.: 16/913,467

(22) Filed: Jun. 26, 2020

(65) Prior Publication Data

US 2020/0411292 A1     Dec. 31, 2020

(30) Foreign Application Priority Data

Jun. 27, 2019  (KR) .................. 10-2019-0076943

(51) Int. Cl.
  *H01J 37/32*   (2006.01)

(52) U.S. Cl.
  CPC .. *H01J 37/32385* (2013.01); *H01J 37/32642* (2013.01); *H01J 37/32715* (2013.01); *H01J 2237/038* (2013.01); *H01J 2237/334* (2013.01)

(58) Field of Classification Search
  CPC ........... H01J 37/32385; H01J 37/32642; H01J 37/32715; H01J 2237/038
  See application file for complete search history.

(56) References Cited

U.S. PATENT DOCUMENTS

| 6,039,836 A | 3/2000 | Dhindsa et al. |
| 6,229,264 B1 | 5/2001 | Ni et al. |

(Continued)

FOREIGN PATENT DOCUMENTS

| KR | 10-2001-0033185 A | 4/2001 |
| KR | 10-2004-0007351 A | 1/2004 |

(Continued)

OTHER PUBLICATIONS

Notice of Allowance for Korean Application No. 10-2010-0108303 dated Dec. 2, 2020.

(Continued)

*Primary Examiner* — Binh X Tran
(74) *Attorney, Agent, or Firm* — Harness, Dickey & Pierce, P.L.C.

(57) ABSTRACT

A substrate treating apparatus includes a chamber having a process space therein, a substrate support unit that supports a substrate in the process space, a gas supply unit that supplies gas into the process space, and a plasma generation unit that generates plasma from the gas, wherein the substrate support unit includes a substrate support part that supports the substrate, a focus ring that surrounds the substrate support part, an insulator located below the focus ring and having a groove formed therein, an electrode provided in the groove formed in the insulator, and an impedance controller that is connected with the electrode and that adjusts impedance of the electrode, and the impedance controller includes a resonance control circuit that adjusts a maximum value of current applied to the electrode and an impedance control circuit that controls an incidence angle of plasma ions in an edge region of the substrate.

13 Claims, 7 Drawing Sheets

(56) References Cited

U.S. PATENT DOCUMENTS

| | | |
|---|---|---|
| 6,344,105 B1 | 2/2002 | Daugherty et al. |
| 6,706,138 B2 | 3/2004 | Barnes et al. |
| 7,850,174 B2 | 12/2010 | Endoh et al. |
| 8,157,952 B2 | 4/2012 | Honda et al. |
| 8,293,068 B2 | 10/2012 | Koshimizu et al. |
| 8,512,510 B2 | 8/2013 | Koshiishi et al. |
| 8,513,563 B2 | 8/2013 | Matsumoto et al. |
| 8,657,848 B2 | 2/2014 | Jenson et al. |
| 8,894,806 B2 | 11/2014 | Koshimizu et al. |
| 9,293,299 B2 | 3/2016 | Yamazawa |
| 10,378,992 B2 | 8/2019 | Penza et al. |
| 2010/0012029 A1 | 1/2010 | Forster et al. |
| 2010/0012480 A1 | 1/2010 | Forster et al. |
| 2013/0008778 A1 | 1/2013 | Hoffman et al. |
| 2014/0034243 A1 | 2/2014 | Dhindsa et al. |
| 2016/0351404 A1* | 12/2016 | Aramaki ........... H01J 37/32183 |
| 2018/0102238 A1* | 4/2018 | Gu .................... H01J 37/32174 |

FOREIGN PATENT DOCUMENTS

| | | |
|---|---|---|
| KR | 100433008 B1 | 5/2004 |
| KR | 10-2004-0063825 A | 7/2004 |
| KR | 10-2005-0025079 A | 3/2005 |
| KR | 10-2005-0050660 A | 5/2005 |
| KR | 100743875 B1 | 7/2007 |
| KR | 10-2008-0020463 A | 3/2008 |
| KR | 10-2008-0032163 A | 4/2008 |
| KR | 10-2009-0073425 A | 7/2009 |
| KR | 10-2009-0110852 A | 10/2009 |
| KR | 10-2009-0125084 A | 12/2009 |
| KR | 10-2009-0129446 A | 12/2009 |
| KR | 10-2010-0061126 A | 6/2010 |
| KR | 2010-0108303 A | 10/2010 |
| KR | 10-2010-0126510 A | 12/2010 |
| KR | 10-2010-0127353 A | 12/2010 |
| KR | 10-2011-0041541 A | 4/2011 |
| KR | 101694754 B1 | 1/2017 |
| KR | 10-2018-0011711 A | 2/2018 |
| KR | 10-2018-0038596 A | 4/2018 |
| KR | 10-2019-0048114 A | 5/2019 |

OTHER PUBLICATIONS

Office Action for Korean Application No. 10-2019-0076943 dated May 20, 2020.

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0076943 filed on Jun. 27, 2019, in the Korean Intellectual Property Office, the entire contents of which are hereby incorporated by reference.

BACKGROUND

Embodiments of the inventive concept described herein relate to an apparatus and method for treating a substrate, and more particularly, relate to a substrate treating apparatus and method for treating a substrate using plasma.

Semiconductor manufacturing processes may include a process of treating a substrate using plasma. For example, among the semiconductor manufacturing processes, an etching process may remove a thin film on a substrate using plasma.

In a substrate treating process using plasma, such as an etching process using plasma, a focus ring mounted on the edge of an electrostatic chuck serves as a guide ring for the position of a substrate during the process and affects generation of plasma and the height of sheath in an edge region of the electrostatic chuck. In particular, depending on the shape of the focus ring, the focus ring may have a great influence on a change in etch uniformity in an edge region of the substrate.

The focus ring is generally formed of a material such as Si, SiC, or quartz. As plasma process time increases, the focus ring is worn or etched by ion bombardment occurring during the process, and the thickness of the focus ring is decreased. As the height of the focus ring is decreased due to the etching of the focus ring, the overall height of sheath is decreased depending on the etched shape of the focus ring. Therefore, the incidence angle of ions in the edge region of the substrate may be gradually inclined toward the center of the substrate. Due to this phenomenon, a process change may be caused, and a substrate pattern profile may be bent.

SUMMARY

Embodiments of the inventive concept provide a substrate treating apparatus and method for controlling an incidence angle of plasma ions in an edge region of a substrate.

The technical problems to be solved by the inventive concept are not limited to the aforementioned problems, and any other technical problems not mentioned herein will be clearly understood from this specification and the accompanying drawings by those skilled in the art to which the inventive concept pertains.

According to an exemplary embodiment, a substrate treating apparatus includes a chamber having a process space therein, a substrate support unit that supports a substrate in the process space, a gas supply unit that supplies gas into the process space, and a plasma generation unit that generates plasma from the gas, wherein the substrate support unit includes a substrate support part that supports the substrate, a focus ring that surrounds the substrate support part, an insulator that is located below the focus ring and that has a groove formed therein, an electrode provided in the groove formed in the insulator, and an impedance controller that is connected with the electrode and that adjusts impedance of the electrode, and the impedance controller includes a resonance control circuit that adjusts a maximum value of current applied to the electrode and an impedance control circuit that controls an incidence angle of plasma ions in an edge region of the substrate.

The resonance control circuit may include an inductor and a first variable capacitor, and the impedance control circuit may include a second variable capacitor.

The resonance control circuit and the impedance control circuit may be connected with each other in parallel.

The impedance controller may further include a control member that adjusts capacitance of the first variable capacitor and capacitance of the second variable capacitor, and the control member may adjust the capacitance of the first variable capacitor such that the electrode has a maximum impedance value.

The control member may control voltage of an upper end of the focus ring by adjusting the capacitance of the second variable capacitor.

The impedance controller may further include a voltage measurement member that measures the voltage of the upper end of the focus ring.

By using information about the incidence angle of the plasma ions in the edge region of the substrate with regard to previously stored voltage of the upper end of the focus ring, the control member may control the capacitance of the second variable capacitor such that the incidence angle of the plasma ions in the edge region of the substrate is adjusted in a preset range.

The capacitance of the second variable capacitor may be adjusted in a range of 10% to 100% of maximum capacitance of the second variable capacitor.

The incidence angle of the plasma ions in the edge region of the substrate may be adjusted such that a slope critical dimension (SCD) is larger than 0.

The electrode may be formed of a metallic material and may be provided in a ring shape.

According to an exemplary embodiment, a substrate treating method of the substrate treating apparatus of the inventive concept includes adjusting capacitance of the first variable capacitor such that the electrode has a maximum impedance value and controlling voltage of an upper end of the focus ring by adjusting capacitance of the second variable capacitor.

By measuring the voltage of the upper end of the focus ring and using information about the incidence angle of the plasma ions in the edge region of the substrate with regard to previously stored voltage of the upper end of the focus ring, the capacitance of the second variable capacitor may be controlled such that the incidence angle of the plasma ions in the edge region of the substrate is adjusted in a preset range.

The capacitance of the second variable capacitor may be adjusted in a range of 10% to 100% of maximum capacitance of the second variable capacitor.

The incidence angle of the plasma ions in the edge region of the substrate may be adjusted such that a slope critical dimension (SCD) is larger than 0.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Other advantages and features of the inventive concept, and implementation methods thereof will be clarified through the following embodiments to be described in detail with reference to the accompanying drawings. The inventive concept may, however, be embodied in different forms and should not be construed as being limited to the embodiments set forth herein. Rather, these embodiments are provided so that this disclosure is thorough and complete and fully conveys the scope of the inventive concept to a person skilled in the art to which the inventive concept pertains. Further, the inventive concept is only defined by the appended claims.

Even though not defined, all terms used herein (including technical or scientific terms) have the same meanings as those generally accepted by general technologies in the related art to which the inventive concept pertains. The terms defined in general dictionaries may be construed as having the same meanings as those used in the related art and/or a text of the present application and even when some terms are not clearly defined, they should not be construed as being conceptual or excessively formal.

Terms used herein are only for description of embodiments and are not intended to limit the inventive concept. As used herein, the singular forms are intended to include the plural forms as well, unless context clearly indicates otherwise. It will be further understood that the terms "comprise" and/or "comprising" used herein specify the presence of stated features or components, but do not preclude the presence or addition of one or more other features or components. In the specification, the term "and/or" indicates each of listed components or various combinations thereof.

Figure 1:
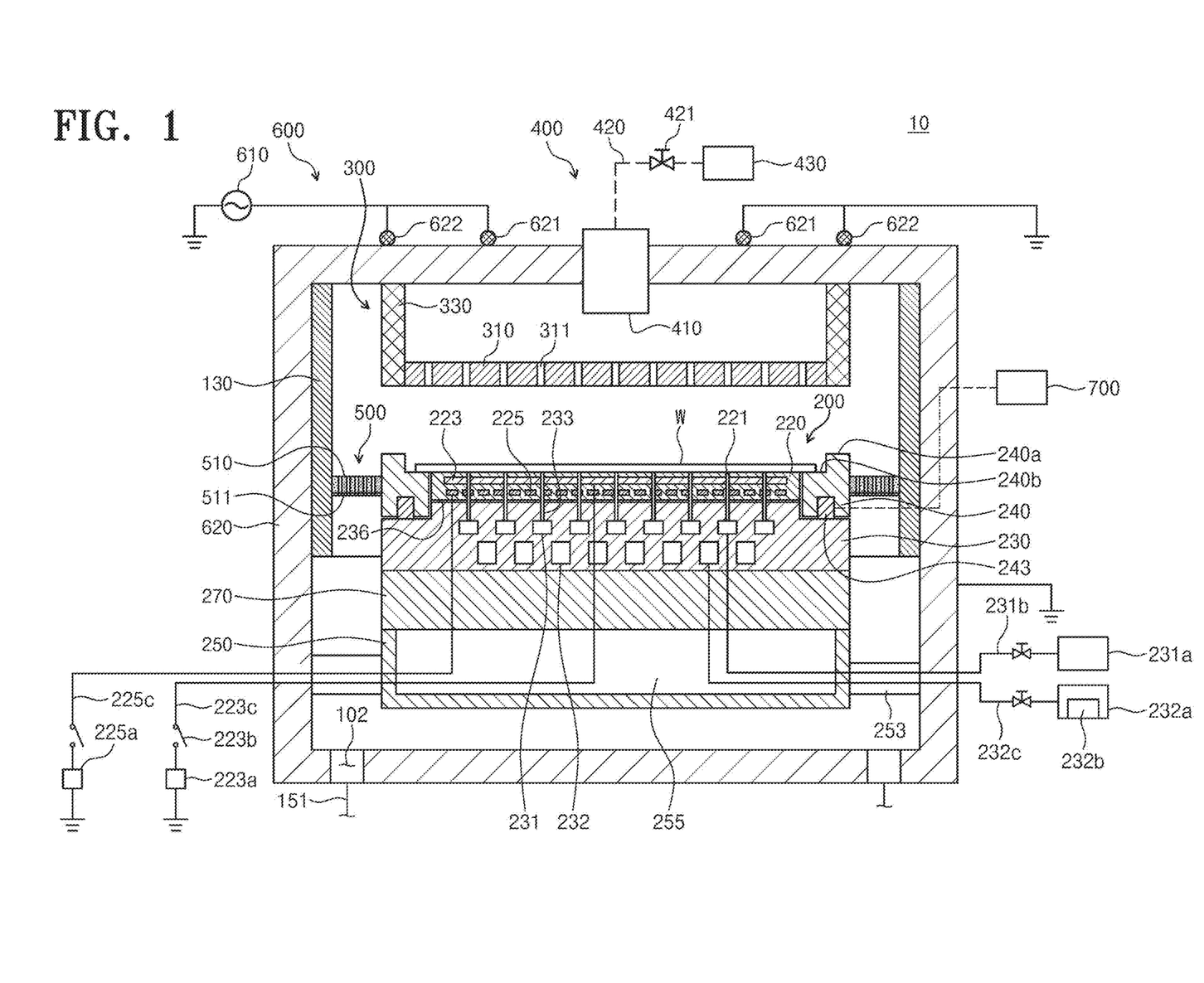
FIG. 1 is a view illustrating a substrate treating apparatus according to an embodiment of the inventive concept.

FIG. 1 is a view illustrating a substrate treating apparatus according to an embodiment of the inventive concept.

Referring to FIG. 1, the substrate treating apparatus 10 treats a substrate W using plasma. For example, the substrate treating apparatus 10 may perform an etching process on the substrate W. The substrate treating apparatus 10 may include a chamber 620, a substrate support assembly 200, a showerhead 300, a gas supply unit 400, a baffle unit 500, and a plasma generation unit 600.

The chamber 620 may provide a process space in which a substrate treating process is performed. The chamber 620 may have the process space therein and may be provided in an enclosed shape. The chamber 620 may be formed of a metallic material. The chamber 620 may be formed of an aluminum material. The chamber 620 may be grounded. The chamber 620 may have an exhaust hole 102 formed in the bottom thereof. The exhaust hole 102 may be connected with an exhaust line 151. Reaction byproducts generated in the substrate treating process and gases staying in the interior space of the chamber 620 may be released to the outside through the exhaust line 151. The pressure in the chamber 620 may be reduced to a predetermined pressure by the exhaust process.

According to an embodiment, a liner 130 may be provided in the chamber 620. The liner 130 may have a cylindrical shape that is open at the top and the bottom. The liner 130 may make contact with an inner surface of the chamber 620. The liner 130 may protect the inner wall of the chamber 620 to prevent the inner wall of the chamber 620 from being damaged by arc discharge. Furthermore, the liner 130 may prevent impurities generated during the substrate treating process from being deposited on the inner wall of the chamber 620. Selectively, the liner 130 may not be provided.

The substrate support assembly 200 may be located in the chamber 620. The substrate support assembly 200 may support the substrate W. The substrate support assembly 200 may include an electrostatic chuck that clamps the substrate W using an electrostatic force. Alternatively, the substrate support assembly 200 may support the substrate W in various manners such as mechanical clamping. Hereinafter, the substrate support assembly 200 including the electrostatic chuck will be described.

The substrate support assembly 200 may include the electrostatic chuck, a lower cover 250, and a plate 270. In the chamber 620, the substrate support assembly 200 may be located to be spaced apart upward from the bottom of the chamber 620.

The electrostatic chuck may include a dielectric plate 220, a body 230, and a ring member 240. The electrostatic chuck may support the substrate W. The dielectric plate 220 may be formed of a dielectric substance in a circular plate shape. The substrate W may be placed on an upper surface of the dielectric plate 220. The upper surface of the dielectric plate 220 may have a smaller radius than the substrate W. Due to this, an edge region of the substrate W may be located outside the dielectric plate 220.

The dielectric plate 220 may include a first electrode 223, a heating unit 225, and a first supply passage 221 inside. The first supply passage 221 may extend from the upper surface of the dielectric plate 220 to a lower surface thereof. A plurality of first supply passages 221 may be formed to be spaced apart from each other and may serve as passages through which a heat transfer medium is supplied to a bottom surface of the substrate W.

The first electrode 223 may be electrically connected with a first power source 223a. The first power source 223a may include a direct current (DC) power source. A switch 223b may be installed between the first electrode 223 and the first power source 223a. The first electrode 223 may be electrically connected with the first power source 223a by turning on/off the switch 223b. When the switch 223b is turned on, DC current may be applied to the first electrode 223. An electrostatic force may be applied between the first electrode 223 and the substrate W by the current applied to the first electrode 223, and the substrate W may be clamped to the dielectric plate 220 by the electrostatic force.

The heating unit 225 may be located under the first electrode 223. The heating unit 225 may be electrically connected with a second power source 225a. The heating unit 225 may generate heat by resisting electric current applied by the second power source 225a. The generated heat may be transferred to the substrate W through the dielectric plate 220. The substrate W may be maintained at a predetermined temperature by the heat generated from the heating unit 225. The heating unit 225 may include a spiral coil.

The body 230 may be located under the dielectric plate 220. The lower surface of the dielectric plate 220 and an upper surface of the body 230 may be bonded together by an adhesive 236. The body 230 may be formed of an aluminum material. A central region of the upper surface of the body 230 may be located in a higher position than an edge region of the upper surface of the body 230. The central region of the upper surface of the body 230 may have an area corresponding to that of the lower surface of the dielectric plate 220 and may be bonded to the lower surface of the dielectric plate 220. The body 230 may have a first circulation passage 231, a second circulation passage 232, and a second supply passage 233 formed therein.

The first circulation passage 231 may serve as a passage through which the heat transfer medium circulates. The first circulation passage 231 may be formed in a spiral shape in the body 230. Alternatively, the first circulation passage 231 may include ring-shaped passages that have different radii and that are concentric with one another. The first circulation passages 231 may be connected together. The first circulation passages 231 may be formed at the same height.

The second circulation passage 232 may serve as a passage through which a cooling fluid circulates. The second circulation passage 232 may be formed in a spiral shape in the body 230. Alternatively, the second circulation passage 232 may include ring-shaped passages that have different radii and that are concentric with one another. The second circulation passages 232 may be connected together. The second circulation passages 232 may have a larger cross-sectional area than the first circulation passages 231. The second circulation passages 232 may be formed at the same height. The second circulation passages 232 may be located under the first circulation passages 231.

The second supply passage 233 may extend upward from the first circulation passages 231 to the upper surface of the body 230. As many second supply passages 233 as the first supply passages 221 may be provided. The second supply passages 233 may connect the first circulation passages 231 and the first supply passages 221.

The first circulation passages 231 may be connected with a heat transfer medium reservoir 231a through a heat transfer medium supply line 231b. The heat transfer medium may be stored in the heat transfer medium reservoir 231a. The heat transfer medium may include an inert gas. According to an embodiment, the heat transfer medium may include a helium (He) gas. The helium gas may be supplied into the first circulation passages 231 through the heat transfer medium supply line 231b. The helium gas may sequentially pass through the second supply passages 233 and the first supply passages 221 and may be supplied to the bottom surface of the substrate W. The helium gas may serve as a medium through which heat transferred from plasma to the substrate W is transferred to the electrostatic chuck.

The second circulation passages 232 may be connected with a cooling fluid reservoir 232a through a cooling fluid supply line 232c. The cooling fluid may be stored in the cooling fluid reservoir 232a. The cooling fluid reservoir 232a may include a cooler 232b therein. The cooler 232b may cool the cooling fluid to a predetermined temperature. Alternatively, the cooler 232b may be installed on the cooling fluid supply line 232c. The cooling fluid supplied into the second circulation passages 232 through the cooling fluid supply line 232c may cool the body 230 while circulating along the second circulation passages 232. The body 230, while being cooled, may cool the dielectric plate 220 and the substrate W together to maintain the substrate W at a predetermined temperature.

The body 230 may include a metal plate. According to an embodiment, the entire body 230 may be implemented with a metal plate.

The ring member 240 may be disposed on an edge region of the electrostatic chuck. The ring member 240 may have a ring shape and may be disposed around the dielectric plate 220. An upper surface of the ring member 240 may have an inner portion 240b and an outer portion 240a located in a higher position than the inner portion 240b. The inner portion 240b of the upper surface of the ring member 240 may be located at the same height as the upper surface of the dielectric plate 220. The inner portion 240b of the upper surface of the ring member 240 may support the edge region of the substrate W that is located outside the dielectric plate 220. The outer portion 240a of the upper surface of the ring member 240 may surround the edge region of the substrate W. The ring member 240 may control an electromagnetic field such that plasma density is uniformly distributed over the entire region of the substrate W. Accordingly, plasma may be uniformly formed over the entire region of the substrate W, and thus regions of the substrate W may be uniformly etched.

The lower cover 250 may be located at the bottom of the substrate support assembly 200. The lower cover 250 may be located to be spaced apart upward from the bottom of the chamber 620. The lower cover 250 may have a space 255 formed therein, which is open at the top. The outer radius of the lower cover 250 may be the same as the outer radius of the body 230. A lift pin module (not illustrated) that moves the transferred substrate W from an external transfer member to the electrostatic chuck may be located in the interior space 255 of the lower cover 250. The lift pin module (not illustrated) may be located to be spaced apart from the lower cover 250 at a predetermined interval. The bottom of the lower cover 250 may be formed of a metallic material. The lower cover 250 may have air in the interior space 255. The air may serve to reduce an electromagnetic field in the substrate support assembly 200 because the air has a lower permittivity than an insulator.

The lower cover 250 may have a connecting member 253. The connecting member 253 may connect an outer surface of the lower cover 250 and the inner wall of the chamber 620. A plurality of connecting members 253 may be provided at predetermined intervals on the outer surface of the lower cover 250. The connecting members 253 may support the substrate support assembly 200 in the chamber 620. Furthermore, the connecting members 253 may be connected with the inner wall of the chamber 620 to allow the lower cover 250 to be electrically grounded. A first power line 223c connected with the first power source 223a, a second power line 225c connected with the second power source 225a, the heat transfer medium supply line 231b connected with the heat transfer medium reservoir 231a, and the cooling fluid supply line 232c connected with the cooling fluid reservoir 232a may extend into the lower cover 250 through interior spaces of the connecting members 253.

The plate 270 may be located between the electrostatic chuck and the lower cover 250. The plate 270 may cover the open top side of the lower cover 250. The plate 270 may have a cross-sectional area corresponding to that of the body 230. The plate 270 may include an insulator. According to an embodiment, one or more plates 270 may be provided. The plates 270 may serve to increase an electrical distance between the body 230 and the lower cover 250.

The showerhead 300 may be located over the substrate support assembly 200 in the chamber 620. The showerhead 300 may be located to face the substrate support assembly 200.

The showerhead 300 may include a gas distribution plate 310 and a support part 330. The gas distribution plate 310 may be located to be spaced apart downward from the top of the chamber 620 by a predetermined distance. A predetermined space may be formed between the gas distribution plate 310 and the top of the chamber 620. The gas distribution plate 310 may be provided in a plate shape having a constant thickness. A bottom surface of the gas distribution plate 310 may be anodized to prevent an electric arc caused by plasma. A section of the gas distribution plate 310 may have the same shape and cross-sectional area as the substrate support assembly 200. The gas distribution plate 310 may include a plurality of injection holes 311. The injection holes 311 may be formed through the gas distribution plate 310 in the vertical direction. The gas distribution plate 310 may contain a metallic material.

The support part 330 may support a lateral portion of the gas distribution plate 310. The support part 330 may be connected, at an upper end thereof, with the top of the chamber 620 and may be connected, at a lower end thereof, with the lateral portion of the gas distribution plate 310. The support part 330 may contain a non-metallic material.

The gas supply unit 400 may supply a process gas into the chamber 620. The gas supply unit 400 may include a gas supply nozzle 410, a gas supply line 420, and a gas reservoir 430. The gas supply nozzle 410 may be installed in a central portion of the top of the chamber 620. The gas supply nozzle 410 may have an injection hole formed in a bottom surface thereof. The injection hole may be used to supply the process gas into the chamber 620. The gas supply line 420 may connect the gas supply nozzle 410 and the gas reservoir 430. The gas supply line 420 may supply the process gas stored in the gas reservoir 430 to the gas supply nozzle 410. A valve 421 may be installed in the gas supply line 420. The valve 421 may open or close the gas supply line 420 and may regulate the flow rate of the process gas supplied through the gas supply line 420.

The baffle unit 500 may be located between the inner wall of the chamber 620 and the substrate support assembly 200. A baffle 510 may have an annular ring shape. The baffle 510 may have a plurality of through-holes 511 formed therein. The process gas supplied into the chamber 620 may pass through the through-holes 511 of the baffle 510 and may be released through the exhaust hole 102. A flow of the process gas may be controlled depending on the shape of the baffle 510 and the shape of the through-holes 511.

The plasma generation unit 600 may excite the process gas in the chamber 620 into a plasma state. According to an embodiment of the inventive concept, the plasma generation unit 600 may be of an inductively coupled plasma (ICP) type. In this case, as illustrated in FIG. 1, the plasma generation unit 600 may include a radio frequency (RF) power source 610 that supplies RF power, and a first coil 621 and a second coil 622 that are electrically connected to the RF power source 610 and that receive the RF power.

In this specification, it has been described that the plasma generation unit 600 is of an inductively coupled plasma (ICP) type. Without being limited thereto, however, the plasma generation unit 600 may be implemented in a capacitively coupled plasma (CCP) type.

When a CCP type plasma source is used, an upper electrode and a lower electrode, that is, a body may be included in the chamber 620. The upper electrode and the lower electrode may be vertically disposed parallel to each other with the process space therebetween. Not only the lower electrode but also the upper electrode may receive energy for generating plasma by being supplied with an RF signal by an RF power source, and the number of RF signals applied to each electrode is not limited to one as illustrated. An electric field may be formed in the space between the two electrodes, and a process gas supplied into the space may be excited into a plasma state. A substrate treating process may be performed by using the plasma.

Referring again to FIG. 1, the first coil 621 and the second coil 622 may be disposed in positions facing the substrate W. For example, the first coil 621 and the second coil 622 may be installed on the top of the chamber 620. The first coil 621 may have a smaller diameter than the second coil 622 and may be located on an inner portion of the top of the chamber 620, and the second coil 622 may be located on an outer portion of the top of the chamber 620. The first coil 621 and the second coil 622 may receive RF power from the RF power source 610 and may induce a time varying magnetic field in the chamber 620. Accordingly, the process gas supplied into the chamber 620 may be excited into plasma.

Hereinafter, a process of treating the substrate W using the above-described substrate treating apparatus 10 will be described.

When the substrate W is placed on the substrate support assembly 200, DC current may be applied from the first power source 233a to the first electrode 223. An electrostatic force may act between the first electrode 223 and the substrate W by the DC current applied to the first electrode 223, and the substrate W may be clamped to the electrostatic chuck by the electrostatic force.

When the substrate W is clamped to the electrostatic chuck, the process gas may be supplied into the chamber 620 through the gas supply nozzle 410. The process gas may be uniformly injected into the chamber 620 through the injection holes 311 of the showerhead 300. RF power generated by the RF power source 610 may be applied to the plasma source. Due to this, an electromagnetic force may be generated in the chamber 620. The electromagnetic force may excite the process gas between the substrate support assembly 200 and the showerhead 300 into plasma. The plasma may be supplied to the substrate W to treat the substrate W. The plasma may be used to perform an etching process.

Figure 2:
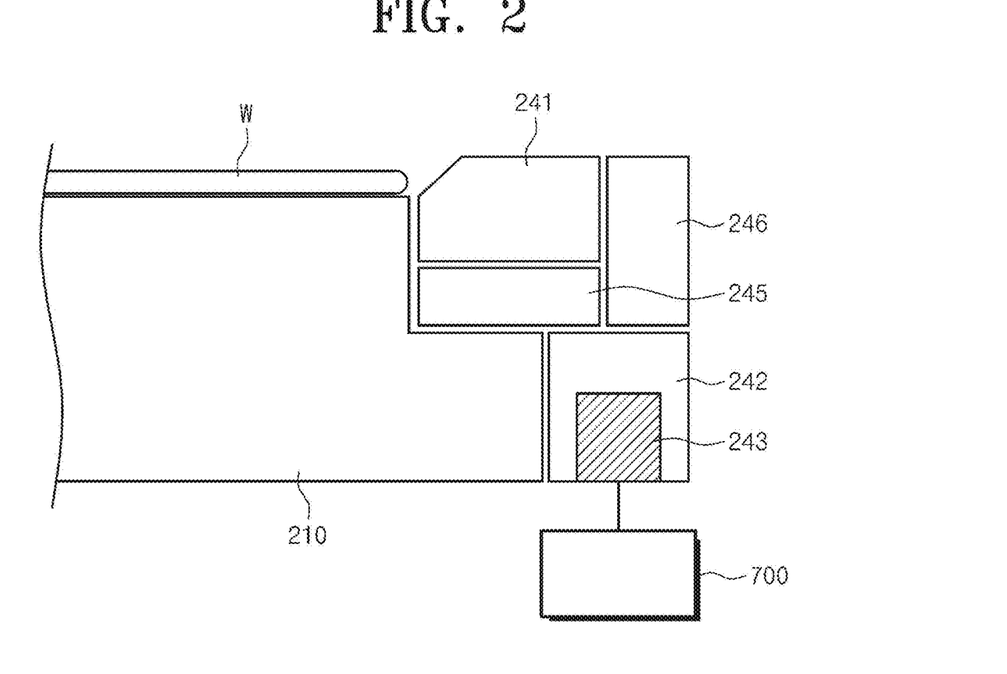
FIG. 2 is a sectional view of a substrate support unit according to an embodiment of the inventive concept.

FIG. 2 is a sectional view of a substrate support unit according to an embodiment of the inventive concept.

As illustrated in FIG. 2, the substrate support unit may include a substrate support part 210, a first ring 241, a second ring 242, an electrode 243, and an impedance controller 700.

As described above, the substrate W may be placed on the electrostatic chuck. The substrate support part 210 may be a support member disposed under the substrate W among the electrostatic chuck.

The first ring 241 may surround the substrate W placed on the substrate support part 210. According to an embodiment, the first ring 241 may be a focus ring. The focus ring may allow ions generated during a plasma process to be concentrated on the substrate W.

The second ring 242 may surround the substrate support part 210. According to an embodiment, the second ring 242 may be an insulator. The second ring 242 may separate the substrate support part 210 and the inner wall of the chamber 620 and may electrically insulate the first ring 241 from modules below the substrate support part 210.

According to an embodiment, a third ring 245 formed of a metallic material may be provided between the first ring 241 and the second ring 242. For example, the third ring 245 may be formed of an aluminum material.

As illustrated in FIG. 2, according to an embodiment, a fourth ring 246 may be additionally provided to surround the first ring 241 and the third ring 245. The fourth ring 246 may be implemented with an insulator.

According to an embodiment of the inventive concept, the second ring 242 may have a groove formed therein, and the electrode 243 may be provided in the groove formed in the second ring 242. The electrode 243 may be connected to the impedance controller 700. The electrode 243 may have a ring shape and may be formed of a metallic material. Furthermore, the electrode 243 may be formed of a dielectric material. The electrode 243 formed of the metallic material or the dielectric material may be provided in the second ring 242 to induce an electric-field coupling effect around the second ring 242. Moreover, the electrode 243 may be provided in the second ring 242 to easily adjust an incidence angle of plasma ions in the edge region of the substrate W.

The degree of RF power coupling between the substrate support part 210 and the first ring 241 may be adjusted through the impedance controller 700. Accordingly, the substrate support unit according to the embodiment of the inventive concept may easily control an electric field and plasma density in the edge region of the substrate W.

Furthermore, the substrate support unit may control an electric field at the edge of the substrate support part 210, thereby controlling an incidence angle of plasma ions incident through plasma sheath formed above the first ring 241.

Referring to FIG. 2, according to an embodiment, the second ring 242 may be disposed below the first ring 241. An upper end of a central region of the substrate support part 210 may be provided in a higher position than an upper end of an edge region of the substrate support part 210. An upper end of the first ring 241 may be provided in a higher position than the upper end of the central region of the substrate support part 210. A lower end of the first ring 241 may be provided in a lower position than the upper end of the central region of the substrate support part 210. Part of the first ring 241 may be located above the edge region of the substrate support part 210. An upper end of the second ring 242 may be located at the same height as, or in a lower position than, the upper end of the edge region of the substrate support part 210.

Figure 3:
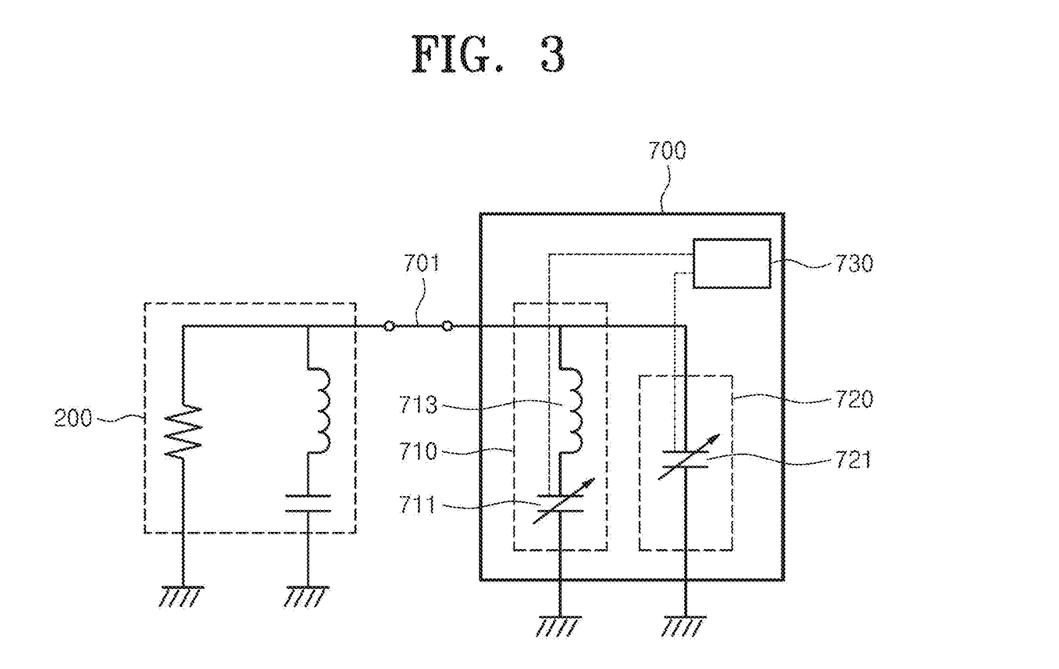
FIG. 3 is a circuit diagram illustrating a specific configuration of an impedance controller according to an embodiment of the inventive concept.

FIG. 3 is a circuit diagram illustrating a specific configuration of the impedance controller according to an embodiment of the inventive concept.

Referring to FIG. 3, the impedance controller 700 may include a resonance control circuit 710 and an impedance control circuit 720. The resonance control circuit 710 may include a first variable capacitor 711 and an inductor 713, and the impedance control circuit 720 may include a second variable capacitor 721. The resonance control circuit 710 may adjust a maximum value of current or voltage applied to the electrode 243. Specifically, the resonance control circuit 710 may constitute the substrate support unit and the impedance controller 700 as a resonance circuit by adjusting the capacitance of the first variable capacitor 711. Accordingly, maximum current or maximum voltage may be applied to the resonance control circuit 710. The impedance control circuit 720 may control an incidence angle of plasma ions in the edge region of the substrate W. Specifically, the impedance control circuit 720 may control the voltage of the upper end of the first ring 241 by adjusting the capacitance of the second variable capacitor 721. As the voltage of the upper end of the first ring 241 is adjusted, the incidence angle of the plasma ions in the edge region of the substrate W may be adjusted. That is, the incidence angle of the plasma ions in the edge region of the substrate W may be determined based on a potential difference between the upper end of the first ring 241 and the upper end of the substrate W. Because the potential of the upper end of the substrate W is determined by RF power applied to the substrate support unit, the impedance control circuit 720 may adjust the incidence angle of the plasma ions in the edge region of the substrate W by adjusting the potential of the upper end of the first ring 241. The resonance control circuit 710 and the impedance control circuit 720 may be connected with each other in parallel.

Figure 4:
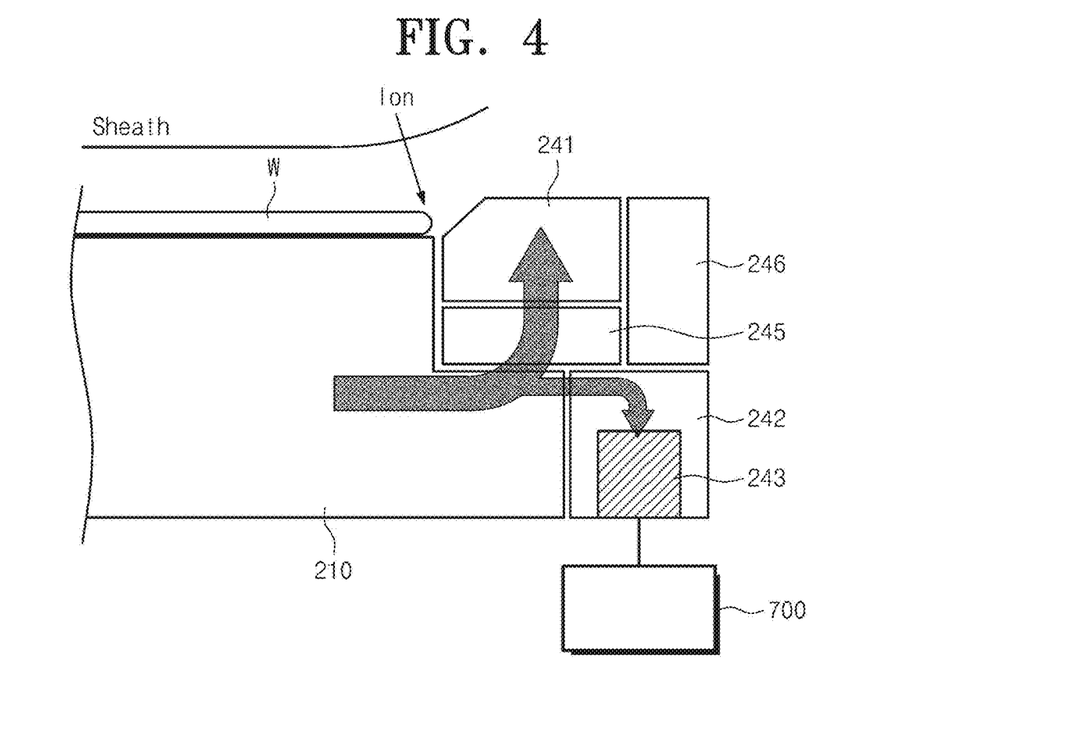
FIGS. 4 to 6 are views illustrating a control method of the impedance controller according to an embodiment of the inventive concept.
Figure 5:
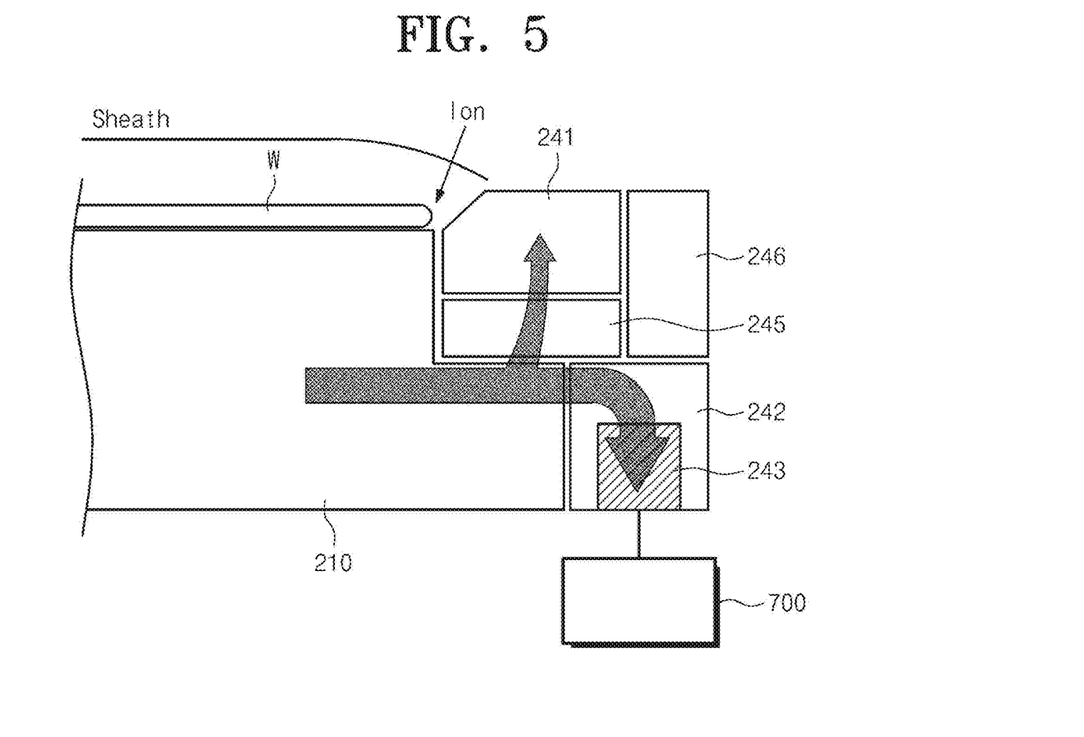

Furthermore, referring to FIG. 3, the impedance controller 700 may further include a control member 730 that adjusts the capacitance of the first variable capacitor 711 of the resonance control circuit 710 and the capacitance of the second variable capacitor 721 of the impedance control circuit 720. The control member 730 may cause the electrode 243 to have a maximum impedance value by adjusting the capacitance of the first variable capacitor 711. Accordingly, maximum current may be applied to the first ring 241 and the electrode 243. Furthermore, the control member 730 may control the voltage of the upper end of the first ring 241 by adjusting the capacitance of the second variable capacitor 721. When the voltage of the upper end of the first ring 241 is adjusted by the control member 730, the incidence angle of the plasma ions in the edge region of the substrate W may be adjusted. Referring to FIG. 4, when the capacitance of the second variable capacitor 721 is adjusted by the control member 730 so as to be decreased, the voltage of the upper end of the first ring 241 may be increased, and accordingly the incidence angle of the plasma ions in the edge region of the substrate W may be adjusted to a direction toward the first ring 241. Furthermore, referring to FIG. 5, when the capacitance of the second variable capacitor 721 is adjusted by the control member 730 so as to be increased, the voltage of the upper end of the first ring 241 may be decreased, and accordingly the incidence angle of the plasma ions in the edge region of the substrate W may be adjusted to a direction toward the center of the substrate W. As described above, the control member 730 may adjust the incidence angle of the plasma ions in the edge region of the substrate W by adjusting the voltage of the upper end of the first ring 241 by adjusting the capacitance of the second variable capacitor 721.

Figure 6:
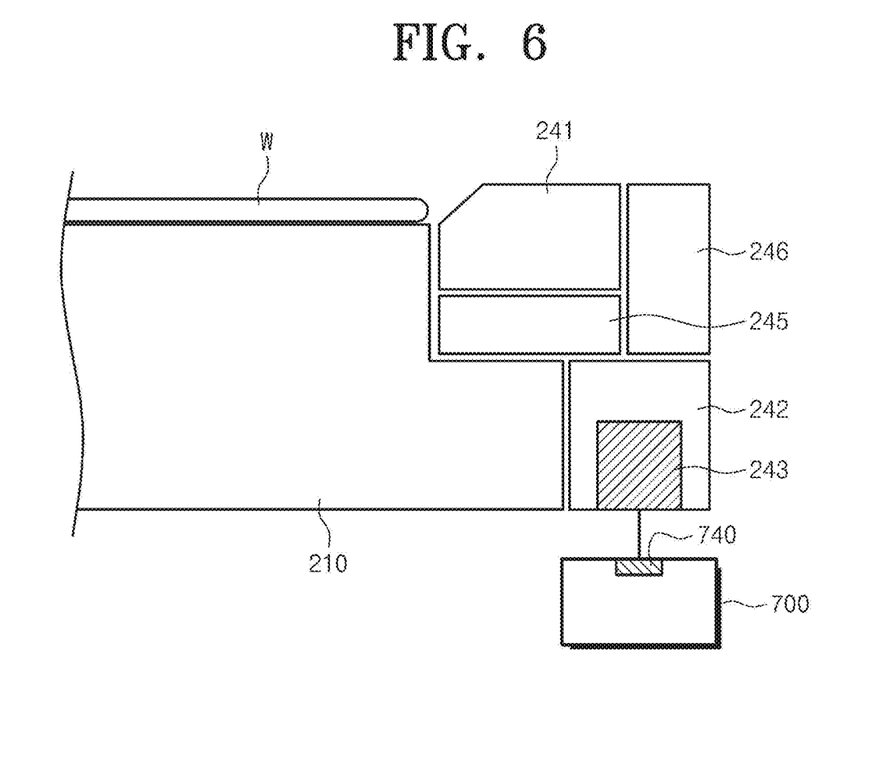

Referring to FIG. 6, the impedance controller 700 may further include a voltage measurement member 740 that measures the voltage of the upper end of the first ring 241. The control member 730 may adjust the capacitance of the second variable capacitor 721, based on the voltage of the upper end of the first ring 241 that is measured by the voltage measurement member 740. For example, by using the incidence angle of the plasma ions in the edge region of the substrate W with regard to previously stored voltage of the upper end of the focus ring, the control member 730 may control the capacitance of the second variable capacitor 721 such that the incidence angle of the plasma ions in the edge region of the substrate W is adjusted in a preset range. That is, the control member 730 may adjust the incidence angle of the plasma ions in the edge region of the substrate W in the preset range by adjusting the voltage of the upper end of the first ring 241, which is measured by the voltage measurement member 740, in the preset range by adjusting the capacitance of the second variable capacitor 721. Here, the preset range may be a range in which a slope critical dimension (SCD) is larger than 0. The SCD may represent the distance from the center of a recessed portion between patterns of the substrate to a point on which etching ions are incident in the horizontal direction. The SCD may have a positive value for a direction toward the edge region of the substrate and may have a negative value for a direction toward the center of the substrate. Furthermore, the capacitance of the second variable capacitor 721 may be adjusted in the range of 10% to 100% of the maximum capacitance of the second variable capacitor 721.

Figure 7:
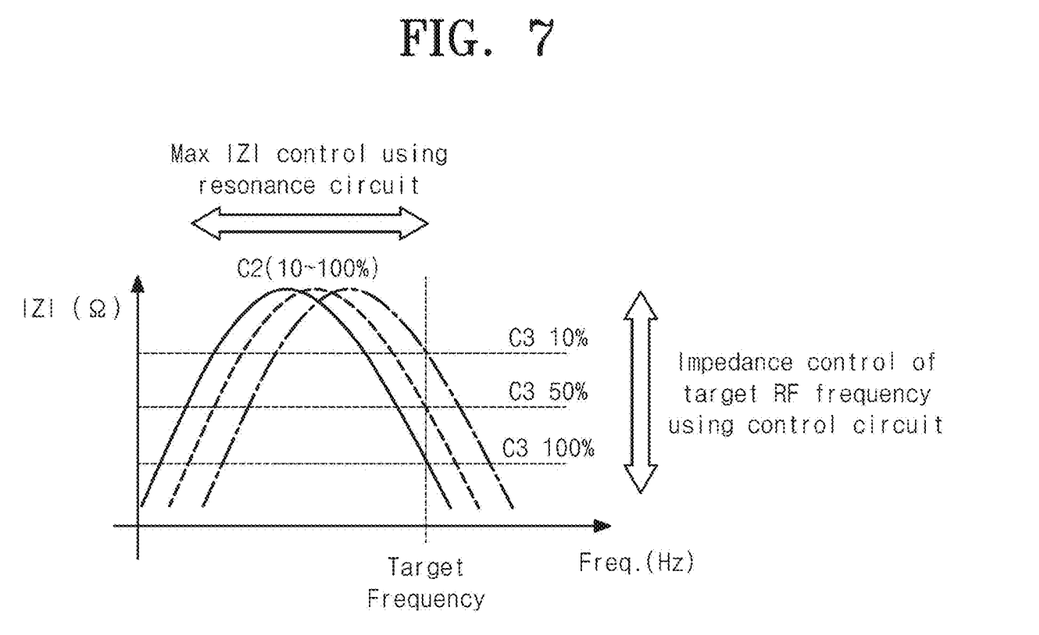
FIGS. 7 to 10 are views illustrating a change in an incidence angle of plasma ions depending on capacitance changes of variable capacitors according to an embodiment of the inventive concept.
Figure 8:
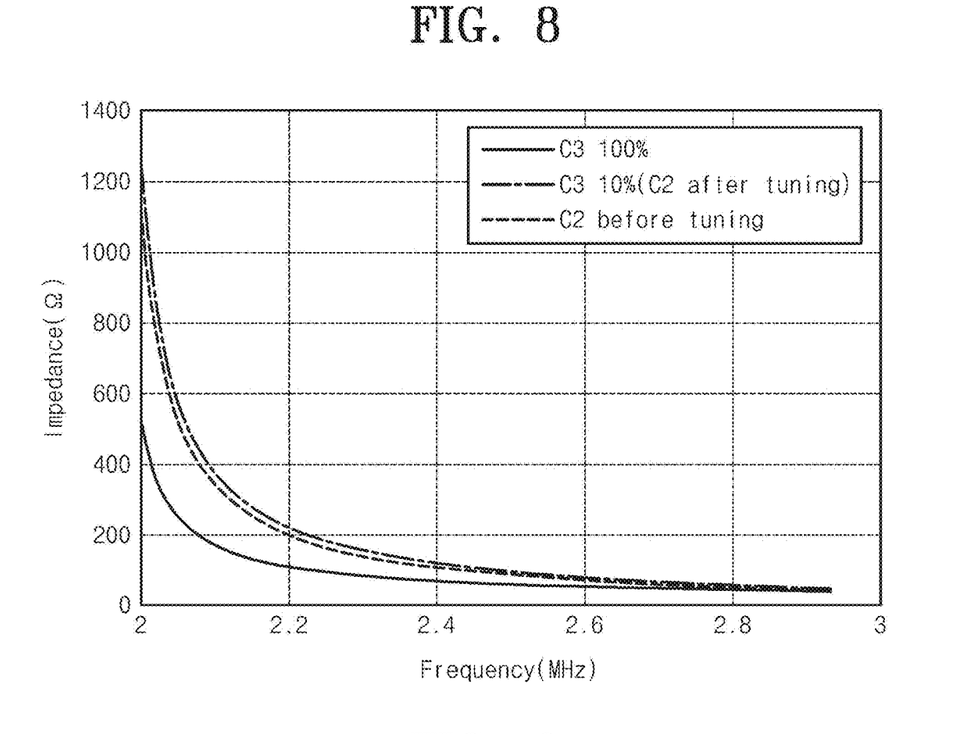
Figure 9:
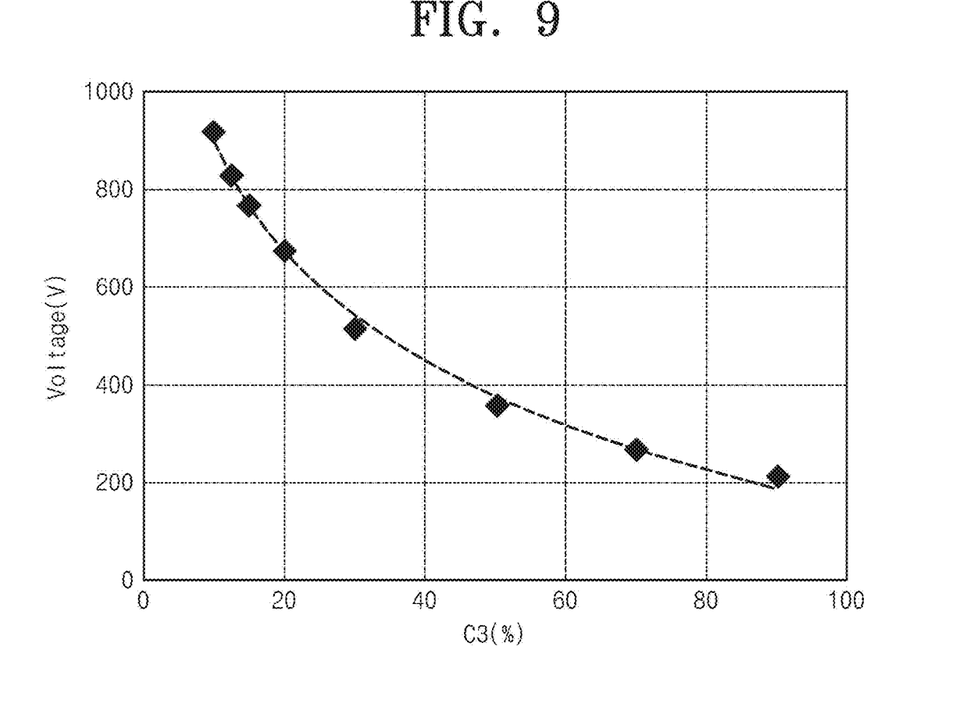
Figure 10:
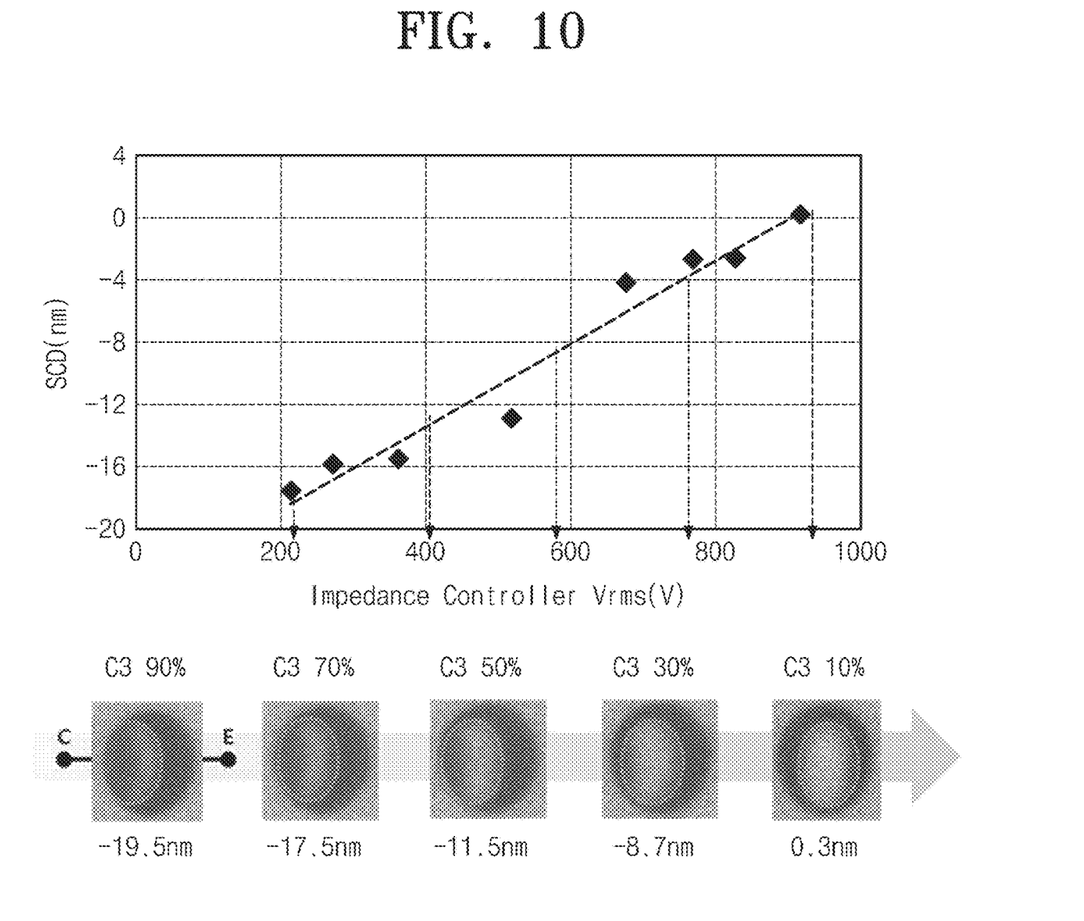

Referring to FIG. 7, at a target frequency of RF power applied to the substrate support unit, a maximum impedance value of the electrode may be adjusted by adjusting the capacitance of the first variable capacitor C2, and the impedance of the electrode may be adjusted by adjusting the capacitance of the second variable capacitor C3. Here, the capacitance of the first variable capacitor C2 and the capacitance of the second variable capacitor C3 may be adjusted in the range of 10% to 100% of the maximum capacitance. Referring to FIG. 8, it can be seen that the maximum impedance value at the target frequency is increased by adjusting the capacitance of the first variable capacitor C2, and it can be seen that when the capacitance of the second variable capacitor C3 is increased to 10% to 100% of the maximum capacitance, the impedance of the electrode is decreased. Furthermore, referring to FIG. 9, it can be seen that the voltage of the upper end of the focus ring is decreased as the capacitance of the second variable capacitor C3 is increased to 10% to 100% of the maximum capacitance. Moreover, as illustrated in FIG. 10, the SCD in the edge region of the substrate may be increased as the voltage of the upper end of the focus ring is increased, and the SCD in the edge region of the substrate may be controlled to have a value larger than 0 by controlling the voltage of the upper end of the focus ring. However, without being limited thereto, the SCD in the edge region of the substrate may be adjusted to a value close to 0.

Figure 11:
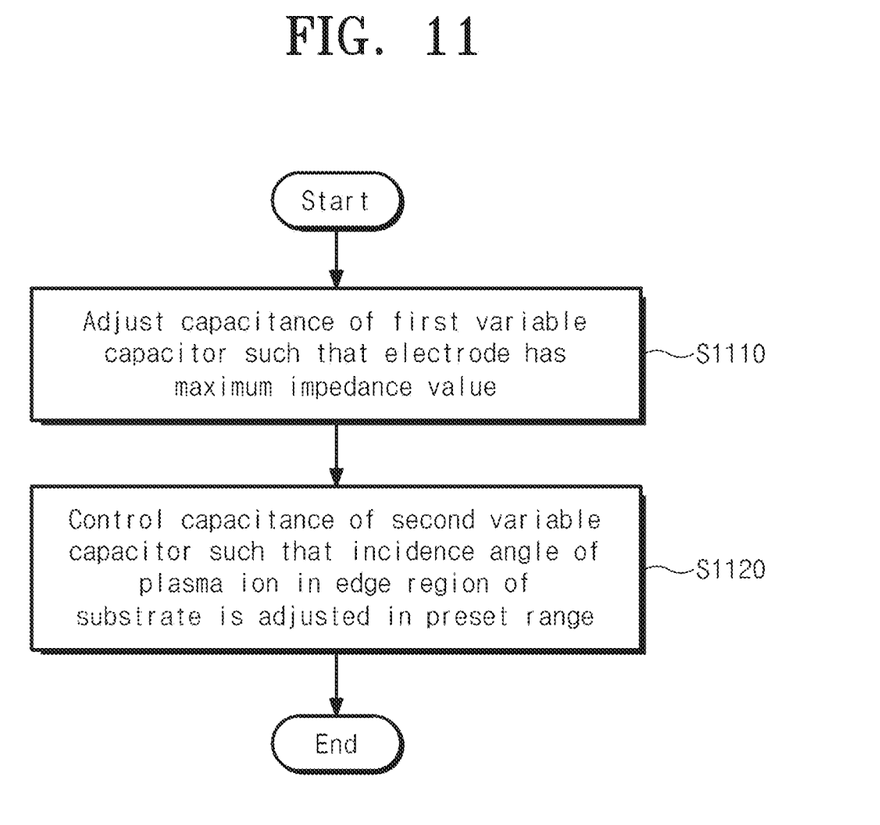
FIG. 11 is a flowchart illustrating a substrate treating method according to an embodiment of the inventive concept.

FIG. 11 is a flowchart illustrating a substrate treating method according to an embodiment of the inventive concept.

Referring to FIG. 11, the capacitance of the first variable capacitor is adjusted such that the electrode has a maximum impedance value (S1110). Thereafter, the capacitance of the second variable capacitor is adjusted such that an incidence angle of plasma ions in the edge region of the substrate is adjusted in the preset range (S1120). For example, by measuring the voltage of the upper end of the focus ring and using information about the incidence angle of the plasma ions in the edge region of the substrate with regard to the previously stored voltage of the upper end of the focus ring, the capacitance of the second variable capacitor may be adjusted such that the incidence angle of the plasma ions in the edge region of the substrate is adjusted in the preset range. Here, the capacitance of the second variable capacitor may be adjusted in the range of 10% to 100% of the maximum capacitance of the second variable capacitor. Furthermore, the incidence angle of the plasma ions in the edge region of the substrate may be adjusted such that the SCD is larger than 0. In addition, the incidence angle of the plasma ions in the edge region of the substrate may be adjusted such that the SCD is close to 0.

As described above, according to the various embodiments, the inventive concept may easily control an incidence angle of plasma ions in an edge region of a substrate.

In addition, the inventive concept may extend a replacement cycle of a focus ring by reducing wear of the focus ring.

Effects of the inventive concept are not limited to the aforementioned effects, and any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. For example, the components illustrated in the embodiments of the inventive concept can be implemented in a distributed manner. Likewise, the components described to be distributed can be implemented in a combined manner. Accordingly, the spirit and scope of the inventive concept should be determined by the technical idea of the claims, and it should be understood that the spirit and scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:
1. A substrate treating apparatus comprising:
   a chamber having a process space therein;
   a substrate support unit configured to support a substrate in the process space;
   a gas supply unit configured to supply gas into the process space; and
   a plasma generation unit configured to generate plasma from the gas,
   wherein the substrate support unit includes,
      a substrate support part configured to support the substrate,
      a focus ring configured to surround the substrate support part,
      an insulator located below the focus ring,
      an electrode provided in the insulator, and
   an impedance controller connected with the electrode and configured to adjust impedance of the electrode,
   wherein the impedance controller includes,
      a resonance control circuit including an inductor and a first variable capacitor,
      an impedance control circuit including a second variable capacitor,
   wherein the resonance control circuit and the impedance control circuit are connected with each other in parallel, and
   wherein the impedance controller further includes a control member configured to adjust capacitance of the first variable capacitor and capacitance of the second variable capacitor.
2. The substrate treating apparatus of claim 1, wherein the resonance control circuit and the impedance control circuit are connected between the electrode and ground.
3. The substrate treating apparatus of claim 1,
   wherein the control member is configured to adjust the capacitance of the first variable capacitor such that the electrode has a maximum impedance value.

4. The substrate treating apparatus of claim 3, wherein the control member controls voltage of an upper end of the focus ring by adjusting the capacitance of the second variable capacitor.

5. The substrate treating apparatus of claim 4, wherein the impedance controller further includes a voltage measurement member configured to measure the voltage of the upper end of the focus ring.

6. The substrate treating apparatus of claim 5, wherein by using information about an incidence angle of plasma ions in an edge region of the substrate with regard to previously stored voltage of the upper end of the focus ring, the control member controls the capacitance of the second variable capacitor such that the incidence angle of the plasma ions in the edge region of the substrate is adjusted in a preset range.

7. The substrate treating apparatus of claim 6, wherein the capacitance of the second variable capacitor is adjusted in a range of 10% to $1^0 0$ of maximum capacitance of the second variable capacitor.

8. The substrate treating apparatus of claim 6, wherein the incidence angle of the plasma ions in the edge region of the substrate is adjusted such that a slope critical dimension (SCD) is larger than 0.

9. The substrate treating apparatus of claim 6, wherein the electrode is formed of a metallic material and is provided in a ring shape.

10. A substrate treating method of the substrate treating apparatus according to claim 2, the substrate treating method comprising:
adjusting capacitance of the first variable capacitor such that the electrode has a maximum impedance value; and
controlling voltage of an upper end of the focus ring by adjusting capacitance of the second variable capacitor.

11. The substrate treating method of claim 10, wherein by measuring the voltage of the upper end of the focus ring, and using information about an incidence angle of plasma ions in an edge region of the substrate with regard to previously stored voltage of the upper end of the focus ring, the capacitance of the second variable capacitor is controlled such that the incidence angle of the plasma ions in the edge region of the substrate is adjusted in a preset range.

12. The substrate treating method of claim 11, wherein the capacitance of the second variable capacitor is adjusted in a range of 10% to 100% of maximum capacitance of the second variable capacitor.

13. The substrate treating method of claim 11, wherein the incidence angle of the plasma ions in the edge region of the substrate is adjusted such that a slope critical dimension (SCD) is larger than 0.

* * * * *